(12) United States Patent
Tanabe et al.

(10) Patent No.: US 7,745,074 B2
(45) Date of Patent: *Jun. 29, 2010

(54) MASK BLANK SUBSTRATE, MASK BLANK, EXPOSURE MASK, MASK BLANK SUBSTRATE MANUFACTURING METHOD, AND SEMICONDUCTOR MANUFACTURING METHOD

(75) Inventors: Masaru Tanabe, Tokyo (JP); Atsushi Kawaguchi, Tokyo (JP); Hiroyuki Akagawa, Tokyo (JP); Akihiro Kawahara, Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/540,405

(22) Filed: Aug. 13, 2009

(65) Prior Publication Data

US 2010/0035164 A1    Feb. 11, 2010

Related U.S. Application Data

(62) Division of application No. 11/237,970, filed on Sep. 29, 2005, now Pat. No. 7,592,104.

(30) Foreign Application Priority Data

Sep. 29, 2004    (JP) .............................. 2004-284093

(51) Int. Cl.
    *G03F 1/00*    (2006.01)
(52) U.S. Cl. .............................................. 430/5; 451/8
(58) Field of Classification Search ................ 430/5, 430/311; 216/12; 451/8
    See application file for complete search history.

(56) References Cited

U.S. PATENT DOCUMENTS

| 6,537,844 | B1 | 3/2003 | Itoh |
| 6,951,502 | B2 * | 10/2005 | Koike et al. ..................... 451/8 |
| 7,455,785 | B2 * | 11/2008 | Koike et al. ................... 216/12 |
| 7,579,120 | B2 * | 8/2009 | Akagawa ........................ 430/5 |
| 7,592,104 | B2 * | 9/2009 | Tanabe et al. .................. 430/5 |
| 2003/0186624 | A1 | 10/2003 | Koike et al. |
| 2004/0137828 | A1 | 7/2004 | Takahashi et al. |
| 2005/0019677 | A1 | 1/2005 | Nakatsu et al. |
| 2005/0019678 | A1 | 1/2005 | Nakatsu et al. |

FOREIGN PATENT DOCUMENTS

| DE | 102004035560 A1 | 3/2005 |
| JP | 2003-50458 A | 2/2003 |

OTHER PUBLICATIONS

German Office Action corresponding to German Patent Application No. 102005046135.2-51, dated Feb. 2, 2010.

* cited by examiner

*Primary Examiner*—Mark F Huff
*Assistant Examiner*—Stewart A Fraser
(74) *Attorney, Agent, or Firm*—Sughrue Mion, PLLC

(57) ABSTRACT

In a mask blank substrate to be chucked by a mask stage of an exposure system, the flatness of a rectangular flatness measurement area excluding an area of 2 mm inward from an outer peripheral end surface on a main surface of the mask blank substrate on its side to be chucked by the mask stage is 0.6 μm or less, and at least three of four corner portions of the flatness measurement area each have a shape that rises toward the outer peripheral side.

15 Claims, 13 Drawing Sheets

MASK BLANK SUBSTRATE, MASK BLANK, EXPOSURE MASK, MASK BLANK SUBSTRATE MANUFACTURING METHOD, AND SEMICONDUCTOR MANUFACTURING METHOD

This is a divisional of application Ser. No. 11/237,970 filed Sep. 29, 2005now U.S. Pat. No. 7,592,104. The entire disclosure of the prior application, application Ser. No. 11/237,970 is hereby incorporated by reference.

This invention claims priority to prior Japanese patent application JP 2004-284093, the disclosure of which is incorporated herein by reference.

BACKGROUND OF THE INVENTION

This invention relates to a mask blank substrate, a mask blank, an exposure mask, a mask blank substrate manufacturing method, and a semiconductor manufacturing method.

Various proposals have been made for methods each for selecting a mask substrate that is excellent in flatness after having been chucked on a mask stage of an exposure system (see, e.g. JP-A-2003-50458).

However, according to the conventional methods, with respect to each of a plurality of mask substrates (mask blank substrates), it is necessary to acquire information indicative of the surface shape of the main surface and information indicative of flatness of the main surface before and after chucking on the mask stage of the exposure system or acquire information indicative of flatness of the main surface through simulation where the flatness of the main surface after setting in the exposure system is derived based on the flatness of the main surface before the setting and a structure of a mask chuck of the exposure system. Therefore, much time and labor have been required for selecting a mask substrate that is excellent in flatness after having been chucked by the mask stage of the exposure system.

SUMMARY OF THE INVENTION

It is therefore an object of this invention to provide a mask blank substrate, a mask blank, an exposure mask, a semiconductor, and manufacturing methods thereof which do not need to simulate flatness of a mask substrate after the mask substrate is chucked by an exposure system as required in the conventional technique and which are excellent in position accuracy and focus budget.

After repeating many tests, it has been found that, in order to form a circuit pattern satisfying a line width and accuracy of a design rule 65 nm node on a semiconductor substrate by setting an exposure mask in an exposure system, the main surface of a mask blank substrate, forming the exposure mask, on its side to be chucked by a mask stage is required to satisfy the following conditions (1) and (2).

It is noted here that the design rule 65 nm node represents Technology Node Half Pitch 65 nm (hp65) shown in INTERNATIONAL TECHNOLOGY ROADMAP FOR SEMICONDUCTORS (LITHOGRAPHY).

Specifically, as a first aspect,
(1) the flatness of a flatness measurement area excluding an area of 2 mm inward from an outer peripheral end surface is 0.6 µm or less; and
(2) at least three of corner portions of the flatness measurement area each have a shape that rises toward the outer peripheral side.

As a second aspect,
(1) the flatness of a flatness measurement area excluding an area of 2 mm inward from an outer peripheral end surface is 0.6 µm or less; and
(2) the shape at a corner portion of the flatness measurement area is such that when a measurement is made of a surface shape of the main surface in a diagonal direction passing through the center of the main surface and connecting two of vertices at four corners of the mask blank substrate, the height at a corner of an outer rectangular area, on the main surface, excluding an area of 10 mm inward from an outer peripheral end surface is not less than −0.02 µm and not more than 0.05 µm using, as a reference, the height at a corner of an inner rectangular area, on the main surface, excluding an area of 15 mm inward from the outer peripheral end surface.

Herein, the flatness is a difference in height from a reference plane which is arbitrarily determined at the side of the front main surface of the substrate between the maximum point and the minimum point of a surface shape in the main surface (a difference in height between the maximum point and minimum point of a measuring face against a virtual absolute plane (focal plane) calculated by least-squares method from the measuring face).

Even when the flatness of the first condition (1) is the same, the shape of the edge portion of the flatness measurement area can be a flat shape, a flagging shape (a roll-off shape, a rolled-edge shape), or a rising shape (ski-jump shape) toward the outer peripheral side. In this regard, the present inventor has found the condition (2) that is required for the corner portion of the flatness measurement area and reached this invention.

When these conditions are satisfied, it is possible to realize a flatness of 0.24 µm or less of an exposure mask when chucked on the mask stage of the exposure system, which is required for the exposure mask by the design rule 65 nm node. If the shape of the corner portion is not adequate, the substrate of the exposure mask is deformed upon chucking so that position accuracy of a transfer pattern, i.e. distance offset between transfer patterns, and uniformity in line width of the transfer pattern are degraded.

This invention has the following structures.

(Structure 1)

A mask blank substrate to be chucked by a mask stage of an exposure system, wherein a flatness of a rectangular flatness measurement area excluding an area of 2 mm inward from an outer peripheral end surface on a main surface of the mask blank substrate on a side to be chucked by the mask stage is 0.6 µm or less, and at least three of four corner portions of the flatness measurement area each have a shape that rises toward an outer peripheral side.

With this structure, the mask blank substrate excellent in flatness after having been chucked by the mask stage of the exposure system can be obtained without requiring much time and labor. Further, it is possible to enhance the position accuracy of a transfer pattern by the use of an exposure mask manufactured based on such a mask blank substrate.

Herein, the flatness is a difference between maximum and minimum values in measurement planes of the substrate surface with respect to a virtual absolute plane (focal plane) calculated by the method of least squares on the basis of the measurement planes. The surface shape of the main surface is not restricted. It may be any shape such as a convex shape, a concave shape, a barrel shape, or a semicylindrical shape.

The reason for defining, as the foregoing condition (1), the flatness measurement area to be an area excluding the area of 2 mm inward from the outer peripheral end surface is that a measurement at the outer peripheral portion is difficult and, even if it is possible, measured values cannot be often accurately indicated. This is further because it is obvious from the characteristics of the manufacturing process that the shape of the outer peripheral portion becomes a roll-off shape.

Edge portions, other than the corner portions, of the flat measurement area may have a roll-off shape. The corner portion is, for example, an area in the vicinity of a corner. The flatness measurement area is an area that is a measurement objective when measuring the flatness of the mask blank substrate. More specifically, it is, for example, an 8 mm square area having, as diagonal vertices, a vertex of a 148 mm square and a vertex of a 132 mm square. For example, when the main surface of the mask blank substrate is 152 mm square, the flatness measurement area is a 148 mm square area.

The exposure system is, for example, a stepper. The mask blank substrate may be a reticle substrate for use in a reticle that is used as a mask for a reduction exposure system. The mask blank substrate is chucked on the mask stage of the exposure system, for example, after having been processed to an exposure mask.

(Structure 2)

The flatness measurement area is an area including a pattern area serving as a rectangular area for formation of a mask pattern, and the rising shape at the corner portion of the flatness measurement area is a shape having a maximum height of 0.25 μm or less using, as a reference point, a corner among corners of the pattern area that is closest to the corner portion of the rising shape.

The pattern area is, for example, an area of 132 mm×110 mm that is set at a center portion of the main surface. In this case, the rising shape of the outer peripheral corner portion as the foregoing condition (2) represents that each corner of the 148 mm square flatness measurement area is higher than a corresponding corner of the 132 mm×110 mm pattern area.

It is preferable in view of a deformation amount after chucking that the rising shape is set to a maximum height of 0.25 μm or less when the corner of the pattern area is used as the reference point. With this structure, it is possible to properly obtain the mask blank substrate that is excellent in flatness after chucking.

(Structure 3)

The flatness measurement area is an area including a pattern area serving as a rectangular area for formation of a mask pattern, and the rising shape at the corner portion of the flatness measurement area is such that when a measurement is made of a surface shape of the main surface in a diagonal direction passing through the center of the main surface and connecting two of vertices at four corners of the mask blank substrate, a height at a corner of an outer rectangular area, on the main surface, excluding an area of 10 mm inward from the outer peripheral end surface is not less than −0.02 μm and not more than 0.05 μm using, as a reference, a height at a corner of an inner rectangular area, on the main surface, excluding an area of 15 mm inward from the outer peripheral end surface. This shape may be the rising shape at the outer peripheral corner as the foregoing condition (2).

(Structure 4)

A mask blank substrate to be chucked by a mask stage of an exposure system, wherein a flatness of a rectangular flatness measurement area excluding an area of 2 mm inward from an outer peripheral end surface on a main surface of the mask blank substrate on a side to be chucked by the mask stage is 0.6 μm or less, the flatness measurement area is an area including a pattern area serving as a rectangular area for formation of a mask pattern, and a shape at a corner portion of the flatness measurement area is such that when a measurement is made of a surface shape of the main surface in a diagonal direction passing through the center of the main surface and connecting two of vertices at four corners of the mask blank substrate, a height at a corner of an outer rectangular area, on the main surface, excluding an area of 10 mm inward from the outer peripheral end surface is not less than −0.02 μm and not more than 0.05 μm using, as a reference, a height at a corner of an inner rectangular area, on the main surface, excluding an area of 15 mm inward from the outer peripheral end surface.

With this structure, the mask blank substrate excellent in flatness after having been chucked by the mask stage of the exposure system can be obtained without requiring much time and labor. Further, it is possible to enhance the position accuracy of a transfer pattern by the use of an exposure mask manufactured based on such a mask blank substrate.

(Structure 5)

The mask stage of the exposure system comprises a chuck member for sticking by suction to the main surface of said mask blank substrate, the chuck member comprising: three support portions extending linearly in parallel to the main surface and supporting the main surface by the use of at least part of the three support portions; and two suction ports formed between the three support portions. By the use of such a three-line support type chuck member, it is possible to obtain the mask blank substrate excellent in flatness after chucking.

(Structure 6)

A mask blank, wherein a thin film to be a mask pattern is formed on the main surface of the mask blank substrate according to structure 1 or 4.

(Structure 7)

A mask blank according to structure 6, wherein the mask blank is adapted for a 65 nm semiconductor design rule. With this structure, it is possible to provide the mask blank that is adaptable to a pattern that has been becoming finer.

(Structure 8)

An exposure mask, wherein a mask pattern is formed on the main surface of the mask blank substrate by patterning the thin film according to structure 6. With this structure, it is possible to provide the exposure mask that is adaptable to a pattern that has been becoming finer.

(Structure 9)

A semiconductor manufacturing method, comprising: setting the exposure mask according to claim 8 on the mask stage of the exposure system; and irradiating exposure light onto the exposure mask to transfer the mask pattern to thereby form a pattern on a semiconductor wafer. With this structure, it is possible to obtain the semiconductor having fine circuit wiring with no pattern defect.

(Structure 10)

A method of manufacturing a mask blank substrate to be chucked by a mask stage of an exposure system, comprising:

polishing a substrate;

measuring a flatness of a flatness measurement area forming part of a main surface of the substrate on a side to be chucked by the mask stage and including a pattern area serving as a rectangular area for formation of a mask pattern while not including an outer peripheral end surface of the substrate; and selecting the substrate in which the flatness of the flatness measurement area falls within a predetermined range and at least three of four corner portions of the flatness measurement area each have a shape that rises toward an outer peripheral side. With this structure, it is possible to obtain the same effect as Structure 1.

(Structure 11)

A method of manufacturing a mask blank substrate to be chucked by a mask stage of an exposure system, comprising:

polishing a substrate;

measuring a flatness of a flatness measurement area forming part of a main surface of the substrate on a side to be chucked by the mask stage and including a pattern area serving as a rectangular area for formation of a mask pattern while not including an outer peripheral end surface of the substrate; and selecting the substrate in which the flatness of the flatness measurement area falls within a predetermined range and a shape at a corner portion of the flatness measurement area is such that when a measurement is made of a surface shape of the main surface in a diagonal direction passing through the center of the main surface and connecting two of vertices at four corners of the mask blank substrate, a height at a corner of an outer rectangular area, on the main surface, excluding an area of 10 mm inward from the outer peripheral end surface is not less than −0.02 μm and not more than 0.05 μm using, as a reference, a height at a corner of an inner rectangular area, on the main surface, excluding an area of 15 mm inward from the outer peripheral end surface. With this structure, it is possible to obtain the same effect as Structure 1.

According to this invention, it is possible to properly obtain a mask blank substrate, a mask blank, and an exposure mask which are each excellent in flatness after having been chucked by a mask stage of an exposure system.

BRIEF DESCRIPTION OF THE DRAWINGS

FIGS. 7A and 7B are diagrams for explaining a final polishing process in further detail, wherein FIG. 7A shows changes in shape of a diagonal section of the mask blank substrate 10 and FIG. 7B shows changes in shape of a transverse section of the mask blank substrate 10;

DESCRIPTION OF THE PREFERRED EMBODIMENT

Now, preferred embodiments according to this invention will be described hereinbelow with reference to the drawings.

Figure 1:
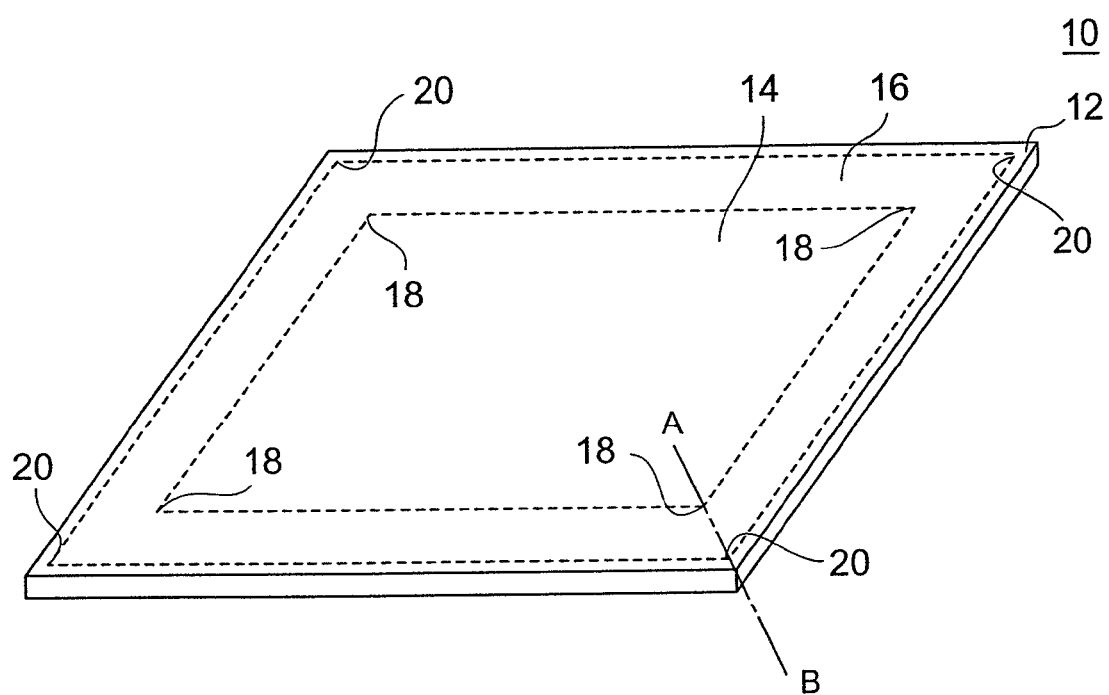
FIG. 1 is a perspective view of a mask blank substrate 10.
Figure 2:
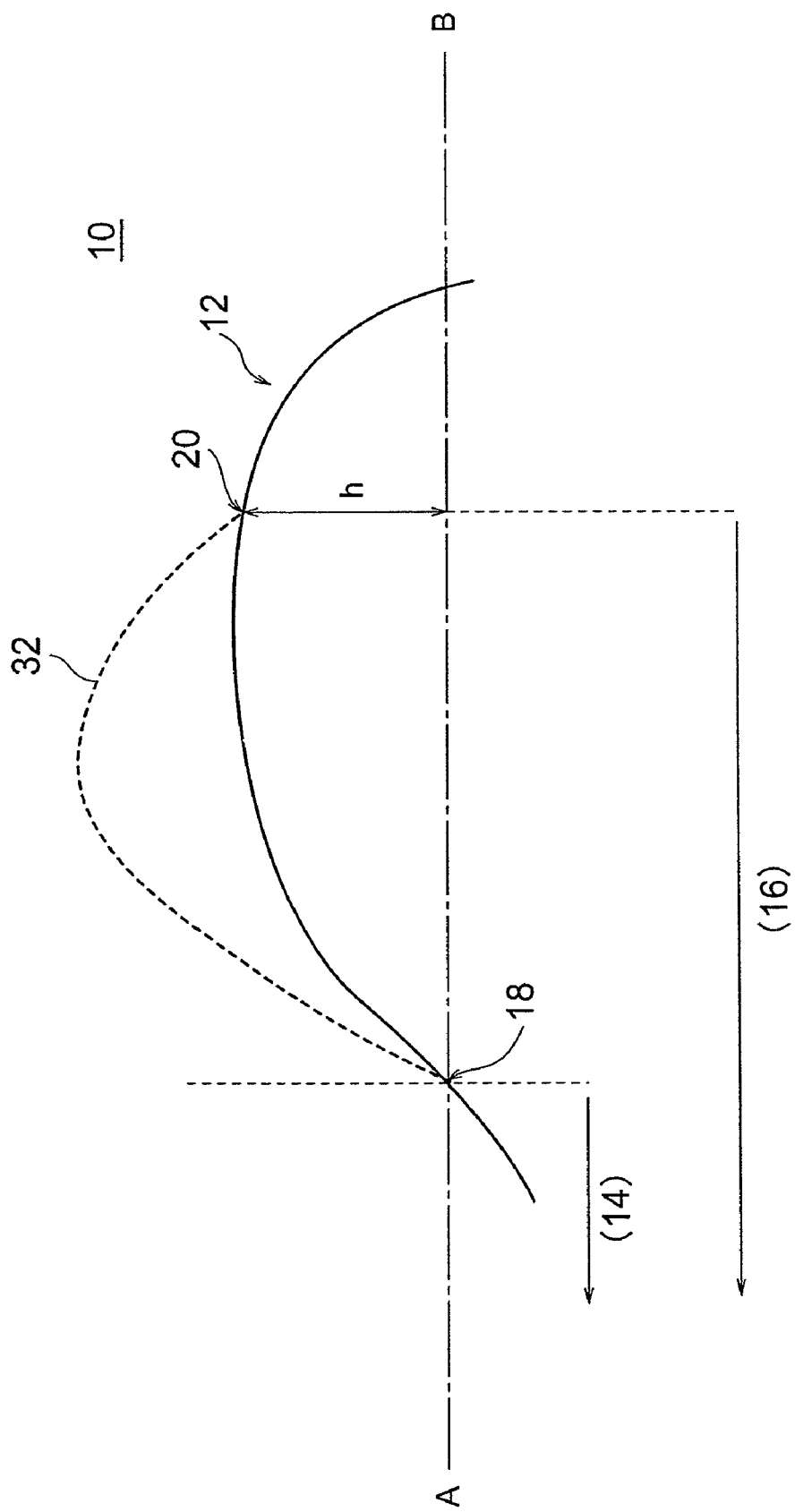
FIG. 2 is a partial sectional view of the mask blank substrate 10.

FIGS. 1 and 2 show one example of a mask blank substrate 10 according to the first embodiment of this invention. FIG. 1 is a perspective view of the mask blank substrate 10. FIG. 2 is a partial sectional view of the mask blank substrate 10 showing the shape of a main surface 12 of the mask blank substrate 10 along a chain line AB shown in FIG. 1.

The mask blank substrate 10 has a pattern area 14 and a flatness measurement area 16 on the main surface 12 on its side to be chucked by a mask stage. The main surface 12 is 152 mm square. Normally, a pattern area of an exposure mask is a rectangular area of 132 mm×110 mm having four corners 18. Therefore, since arrangement of the pattern area 14 is not normally determined in a stage of the mask blank substrate, the pattern area 14 in the mask blank substrate is set to a 132 mm square area assuming that 132 mm×110 mm is rotated by 90°. On the other hand, the flatness measurement area 16 is a 148 mm square area having four corners 20. The flatness of the flatness measurement area 16 is 0.6 μm or less.

At least three of four corner portions of the flatness measurement area 16 each have, as shown in FIG. 2, a shape that rises toward the outer peripheral side. The direction toward the outer peripheral side is a direction going from the corner 18 of the pattern area 14 toward the corner 20 of the flatness measurement area 16. This rising shape has a height h of 0.25 μm or less. The height h is a height of the corner 20 with respect to the corner 18 as a reference point. If the height h is 0.25 μm or less, the shape of the main surface 12 between the corner 18 and the corner 20 is not questioned. As shown, for example, by a dotted line 32, the main surface 12 may once rise higher than 0.25 μm between the corner 18 and the corner 20.

Figure 3:
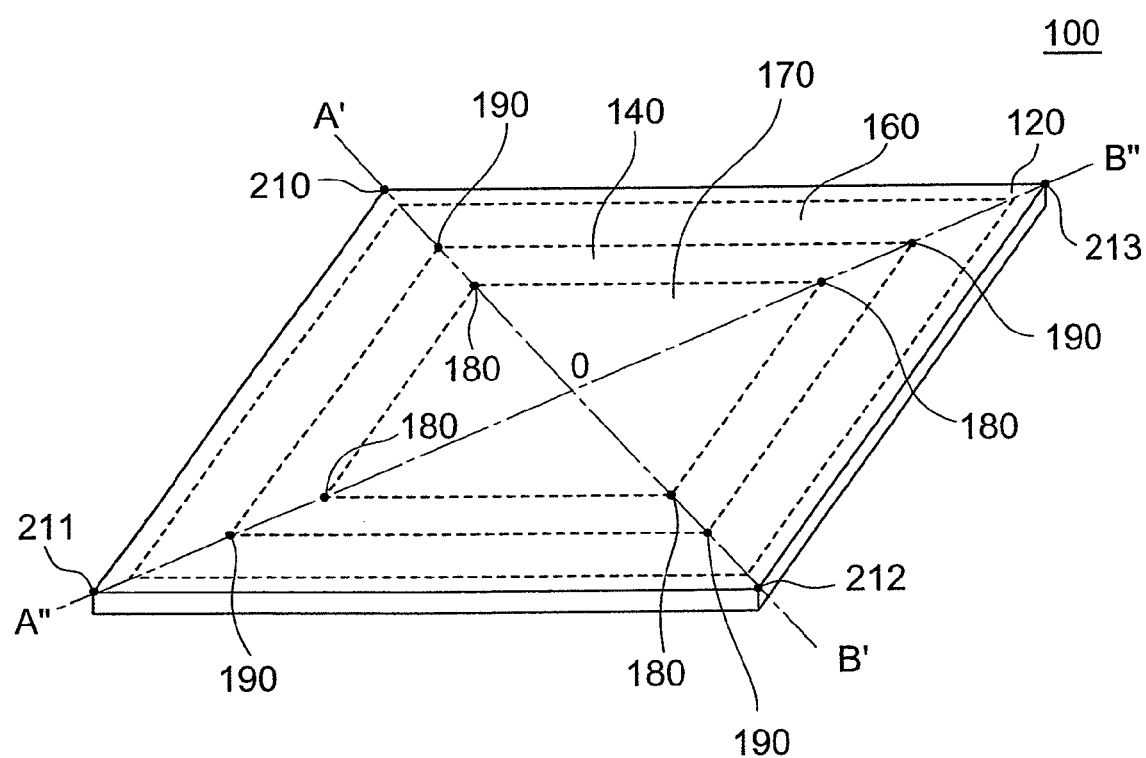
FIG. 3 is a perspective view of a mask blank substrate 100.
Figure 4:
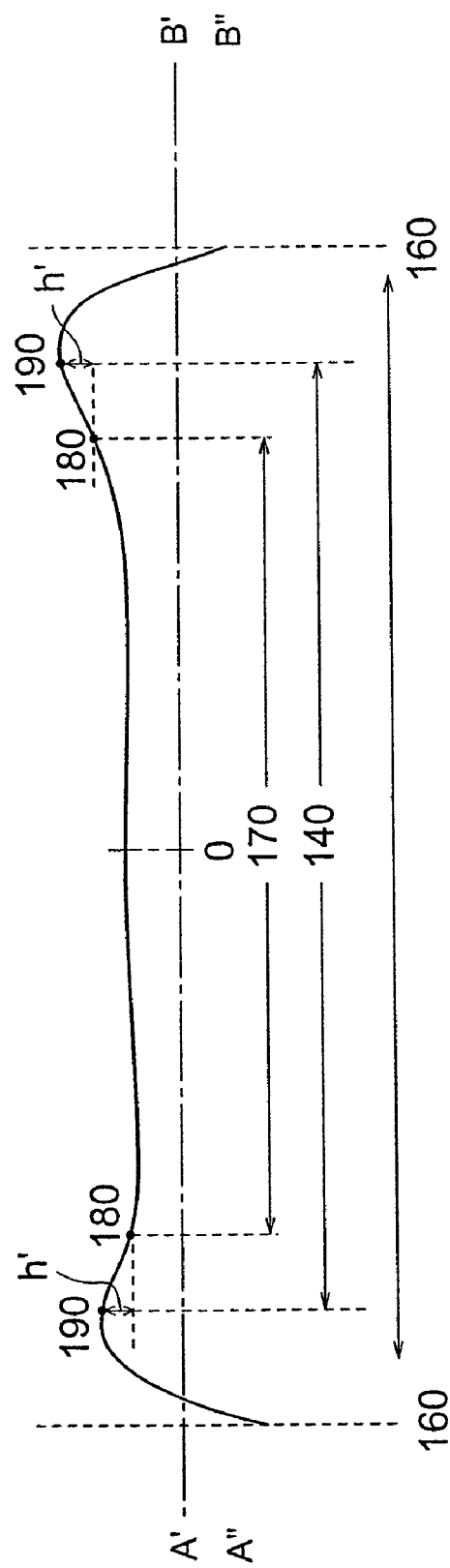
FIG. 4 is a partial sectional view of the mask blank substrate 100.

FIGS. 3 and 4 show one example of a mask blank substrate 100 according to the second embodiment of this invention. FIG. 3 is a perspective view of the mask blank substrate 100. FIG. 4 is a partial sectional view of the mask blank substrate 100 showing the shape of a main surface 120 of the mask blank substrate 100 along a chain line (A'B' or A"B") shown in FIG. 3.

The mask blank substrate 100 has a pattern area 140 and a flatness measurement area 160 on the main surface 120 on its side to be chucked by a mask stage. The main surface 120 is 152 mm square. A pattern area of an exposure mask is generally a rectangular area of 132 mm×110 mm. Therefore, since arrangement of the pattern area 140 is not normally determined in a stage of the mask blank substrate, the pattern area 140 in the mask blank substrate is set to a 132 mm square area assuming that 132 mm×110 mm is rotated by 90°. The flatness of the flatness measurement area 160 is 0.6 μm or less.

The shape of a corner portion of the flatness measurement area 160 is a shape having a height h' which is defined as follows. Specifically, the shape is such that when, in FIGS. 3 and 4, a measurement is made of the surface shape of the substrate main surface in a diagonal direction (along a diagonal line A'B' or A"B") passing through the center O of the substrate main surface and connecting two of vertices 210, 211, 212, and 213 (i.e. vertices 210 and 212 or vertices 211 and 213) at four corners of the substrate, the height h' at a corner 190 of an outer rectangular area (equal to the pattern area 140 in this case) excluding an area of 10 mm inward from an outer peripheral end surface on the substrate main surface is not less than −0.02 μm and not more than 0.05 μm using, as a reference, a height at a corner 180 of an inner rectangular area 170 excluding an area of 15 mm inward from the outer peripheral end surface on the substrate main surface.

The mask blank substrate 10, 100 is formed with a thin film, which becomes a mask pattern, on the main surface so as to be a mask blank. Further, by patterning the thin film, the mask blank substrate 10, 100 is formed with the mask pattern on the main surface so as to be an exposure mask.

A material of the mask blank substrate 10, 100 is not particularly limited and is selected depending on an exposure light source to be used. For example, in the case of a mask blank for ArF excimer laser exposure or a mask blank for F2 excimer laser exposure, a synthetic quartz glass is used. On the other hand, in the case of a mask blank for EUV exposure, a substrate material having a low thermal expansion coefficient (e.g. $SiO_2$—$TiO_2$-based glass, synthetic quartz glass, or crystallized glass with deposited β-quartz solid solution) is used for suppressing strain of a transferred pattern caused by heat upon exposure.

The thin film, to be the mask pattern, formed on the main surface of the mask blank substrate 10, 100 is a thin film that causes an optical change with respect to exposure light (light emitted from an exposure light source) used upon transfer to a transfer target. As the thin film, use may be made of a light shielding film for shielding exposure light, a phase shift film for changing a phase difference of exposure light, a reflecting film for reflecting exposure light, or a light absorber film for absorbing exposure light.

As the light shielding film, use may be generally made of a Cr film, a Cr alloy film selectively containing oxygen, nitrogen, carbon, and fluorine in Cr, a stacked film of them, a MoSi film, a MoSi alloy film selectively containing oxygen, nitrogen, and carbon in MoSi, a stacked film of them, or the like.

As the phase shift film, other than a $SiO_2$ film having only a phase shift function, use may be made of a metal silicide oxide film, a metal silicide nitride film, a metal silicide oxide nitride film, a metal silicide oxide carbide film, a metal silicide oxide nitride carbide film (metal: transition metal such as Mo, Ti, W, or Ta), a CrO film, a CrF film, a halftone film such as a SiON film, or the like each having a phase shift function and a light shielding function.

As the reflecting film, use may be made of a material of a Mo/Si periodic multilayer film, a Ru/Si periodic multilayer film, a Mo/Be periodic multilayer film, a Mo compound/Si compound periodic multilayer film, a Si/Nb periodic multilayer film, a Si/Mo/Ru periodic multilayer film, a Si/Mo/Ru/Mo periodic multilayer film, a Si/Ru/Mo/Ru periodic multilayer film, or the like.

As the light absorber film, use may be made of Ta, a Ta alloy (e.g. a material containing Ta and B or a material containing Ta, B, and N), Cr, a Cr alloy (e.g. a material obtained by adding at least one element of nitrogen, oxygen, carbon, and fluorine to Cr), or the like.

The foregoing thin film may be formed by a sputtering method such as DC sputtering, RF sputtering, or ion beam sputtering. The mask blank of this invention may be further formed with a resist film on the above-mentioned thin film.

Figure 5:
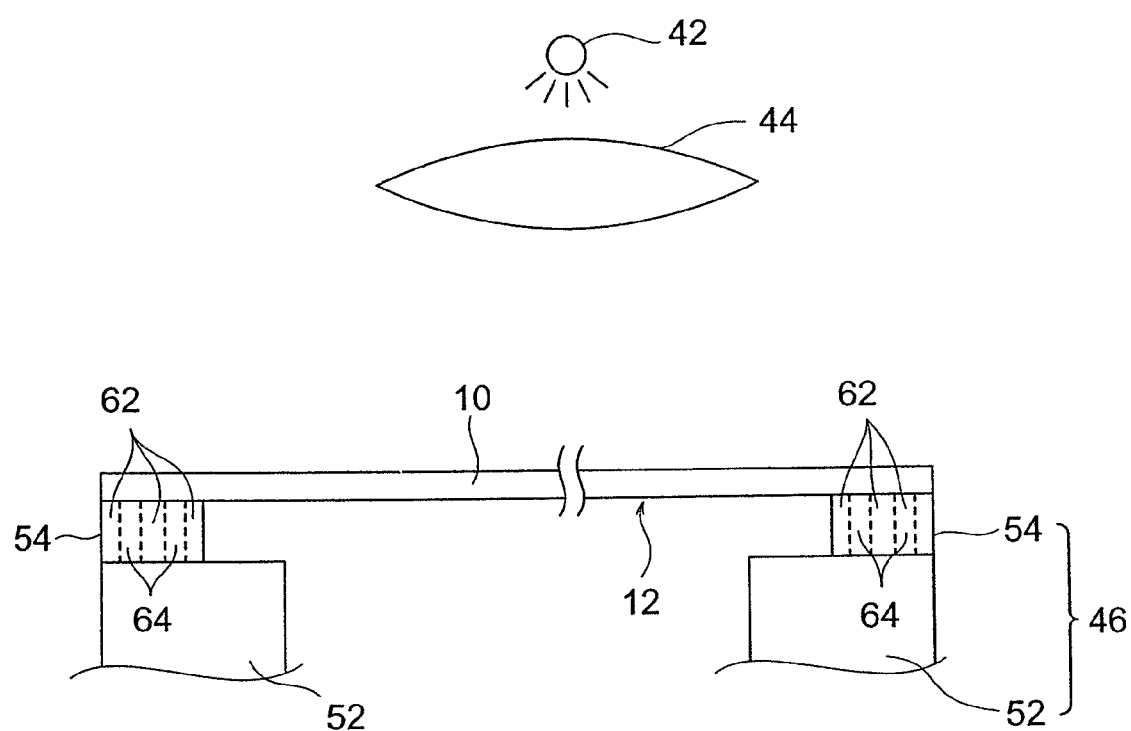
FIG. 5 is a diagram showing one example of a structure of a mask stage 46 and is a side view of the mask stage 46.

FIG. 5 is a diagram showing one example of a structure of a mask stage 46 for chucking the mask blank substrate 10, 100 and is a side view of the mask stage 46.

In this example, the mask stage 46 comprises a base 52 and two chuck members 54. The base 52 serves to fix the chuck members 54.

Each chuck member 54 is a three-line support type comprising three parallel support portions 62 and two suction ports 64 formed between the support portions 62. The suction ports 64 are connected to a vacuum system (not shown), for example, through the base 52 so as to stick to the main surface 12 of the mask blank substrate 10 by suction. In this manner, the mask stage 46 retains the mask blank substrate 10 so as to face an exposure light source 44 and an exposure lens 44.

Herein, the two chuck members 54 are provided so as to correspond to opposing two sides of the main surface 12 of the mask blank substrate 10, respectively. The three support portions 62 of each chuck member 54 extend in parallel to the corresponding side of the main surface 12, while, the two suction ports 64 stick to the vicinity of the corresponding side of the main surface 12.

Each chuck member 54 may stick to a peripheral portion of the main surface of the mask blank substrate that is located outside the flatness measurement area 16 (see FIG. 1) or lies over the inside and outside of the flatness measurement area 16. In the case where the chuck member 54 lies over the inside and outside of the flatness measurement area 16, at least one of the three support portions 62 is provided so as to be brought into contact with the outside of the flatness measurement area 16, while, the other two or one support portion 62 is provided so as to be brought into contact with the inside of the flatness measurement area 16.

A portion of the mask blank substrate 10 that contacts the chuck member 54 may be not completely flat. In such a case, in actual use, the mask stage 46 supports the mask blank substrate 10 by the use of, for example, inner two of the three support portions 62.

It is preferable that the shape of the peripheral portion, excluding the corner portions, of the main surface 12 of the mask blank substrate 10 is a rolled-edge shape. This makes it possible to properly support the mask blank substrate 10 by the use of the two support portions 62 of each chuck member 54. The rolled-edge shape is a roll-off shape where a point at an edge portion of the flatness measurement area 16 is lower than a point at an edge portion of the pattern area 14 (see FIG. 1).

In this example, each chuck member of the mask stage may have a shape and structure as shown, for example, in International Publication No. WO 02/065519.

Hereinbelow, description will be made of a method of manufacturing the mask blank substrate of this invention.

The mask blank substrate 10 having the foregoing shape of the main surface 12 can be manufactured, for example, by the following manufacturing method. Hereinafter, the mask blank substrate 10 can also be read as the mask blank substrate 100 having the shape of the main surface 120.

(1) After measuring the surface shape and flatness of the main surface of a mask blank substrate, a shape adjustment is performed by locally applying surface processing based on the result of the measurement so that the surface shape of the main surface satisfies the shape defined as described above. If desired, the main surface of the substrate is polished before the measurement of the surface shape and flatness or after the shape adjustment has been finished.

(2) With respect to polishing processes with a plurality of stages, a change in shape in each polishing process is recognized in advance. By fitting of the surface shape and flatness of the main surface of the substrate in each polishing process, the surface shape and flatness defined as described above are achieved.

In the foregoing manufacturing method (1), individual processing is carried out per substrate, for example, by a magnetorheological finishing (MRF) method in each polishing process. Therefore, it is possible to appropriately manufacture the mask blank substrate 10 having the required surface shape and flatness.

Figure 6:
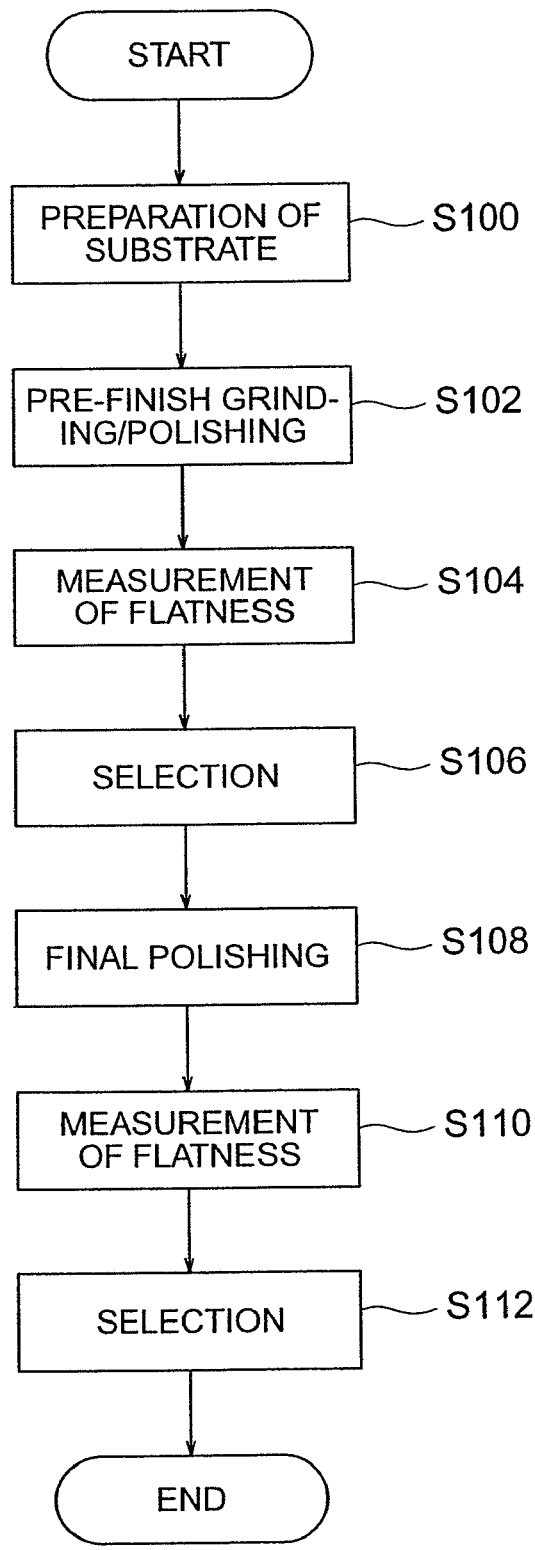
FIG. 6 is a flowchart showing one example of a method of manufacturing the mask blank substrate 10.

FIG. 6 is a flowchart showing one example of a method of manufacturing the mask blank substrate 10 corresponding to the foregoing manufacturing method (2). In the manufacturing method of this example, a substrate serving as a base member of the mask blank substrate 10 is first prepared (S100) and then pre-finish grinding/polishing is carried out with respect to this substrate (S102). This pre-finish grinding/polishing may be a process including a plurality of grinding/polishing processes such as grinding, primary polishing, secondary polishing, and so on. The grinding is processing for the purpose of improving the flatness on the surface of the substrate and removing cracks on the surface of the substrate. The primary polishing and the secondary polishing are processing for reducing in turn the surface roughness of the surface of the substrate. For example, the primary polishing and the secondary polishing are each a process of performing polishing by the use of an abrasive material containing cerium oxide as a main component and by the use of a double-side polishing machine that performs double-side polishing of a plurality of (e.g. about 20) substrates simultaneously while the substrates are epicyclically moved between upper and lower surface plates to which abrasive pads are stuck.

Then, the flatness of the polished substrate is measured (S104) and selection is made of the substrate that is suitable for finally obtaining a satisfactory product (S106). In step S106, selection is made of a substrate satisfying, for example, the following (1) to (3).

(1) A portion near the center of the main surface has a convex shape and the shape of contour lines each representing the same flatness is close to that of concentric circles.
(2) At least three of four corners of the main surface each have a rising shape.
(3) The lowest level exists between the center and the edge portion of the main surface.

Accordingly, a substrate having a saddle-shaped main surface is removed in step S106.

The polishing conditions in the secondary polishing for obtaining a substrate satisfying the foregoing (1) to (3) are such that surface plate accuracy of the double-side polishing machine (when a measurement is made, using a certain reference length, of the surface shape of the surface of the surface plate on its side where the abrasive pad is stuck, a difference between maximum and minimum values in the surface shape with respect to a reference plane calculated by the method of least squares) is set to 100 μm or less and the processing pressure upon polishing is set to 50 to 150 g/cm$^2$. Under this condition, excellent yield can be obtained.

Then, final polishing is performed by the use of an abrasive material containing colloidal silica as a main component and suede-type abrasive pads (S108). This final polishing is double-side mirror polishing with respect to a plurality of substrates selected in step S106. This final polishing is, like the foregoing, performed by the use of a double-side polishing machine that performs double-side polishing of a plurality of (e.g. about 20) substrates simultaneously while the substrates are epicyclically moved between upper and lower surface plates to which abrasive pads are stuck. By this final polishing, the corner portions (four corners) of the flatness measurement area 16 are processed to the rising shape as described with reference to FIG. 2.

Subsequently, the flatness of the substrate is measured again (S110) and selection is made, as a finished product of the mask blank substrate 10, of the substrate in which the flatness of the flatness measurement area 16 is 0.6 μm or less and at least three of four corner portions of the flatness measurement area 16 each have the shape that rises toward the outer peripheral side (S112).

The polishing conditions in the final polishing for satisfying this condition are such that surface plate accuracy of the double-side polishing machine is set to 50 μm or less, the processing pressure upon polishing is set to 50 to 100 g/cm$^2$, and the hardness of each abrasive pad is set to 80 (Asker-C) or less. Under this condition, excellent yield can be obtained.

According to the manufacturing method as described above, it is possible to properly obtain the mask blank substrate 10 that satisfies the necessary conditions under which the flatness of an exposure mask after having been chucked by the mask stage of the exposure system becomes excellent. By the use of this mask blank substrate 10, it is possible to appropriately obtain a mask blank and an exposure mask.

In the final polishing in step S108, the corner portions of the substrate are sometimes processed in a roll-off direction (convexing direction) due to sinking of the abrasive pads and so on. Therefore, in the pre-finish grinding/polishing in step S102, it is preferable to polish the substrate into a slightly concave shape. In step S106, it is preferable to select the substrate in consideration that the substrate is polished in the convexing direction in the final polishing.

In steps S104 and S110, the flatness is measured by an optical interference method. This method measures the flatness by applying coherent light such as laser light to the surface of a substrate to obtain reflected light and observing a difference in height of the surface of the substrate as a phase shift of the reflected light. In this method, the measurement cannot be accurately performed in a predetermined area (about 2 mm) from a boundary between the main surface and the outer peripheral end surface of the substrate, thereby affecting the reliability of flatness. In view of this, in this example, a portion of the main surface without this area is determined as the flatness measurement area.

The mask blank substrate 100 of the second embodiment is obtained by selecting, in step S112, a substrate in which the flatness of the flatness measurement area 160 is 0.6 μm or less and the shape at a corner portion of the flatness measurement area 160 is such that when a measurement is made of the surface shape of the main surface of the substrate in a diagonal direction passing through the center of the main surface of the substrate and connecting two of the vertices at four corners of the substrate, the height at a corner of an outer rectangular area, on the main surface of the substrate, excluding an area of 10 mm inward from the outer peripheral end surface is not less than −0.02 μm and not more than 0.05 μm using, as a reference, the height at a corner of an inner rectangular area, on the main surface of the substrate, excluding an area of 15 mm inward from the outer peripheral end surface.

Figure 7A:
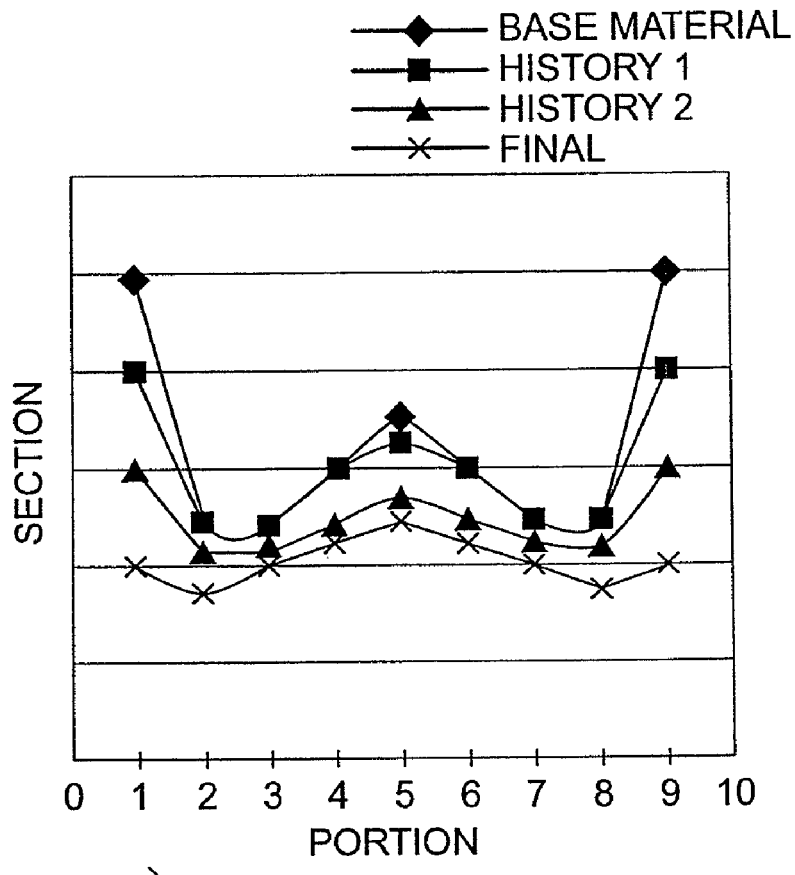
Figure 7A:
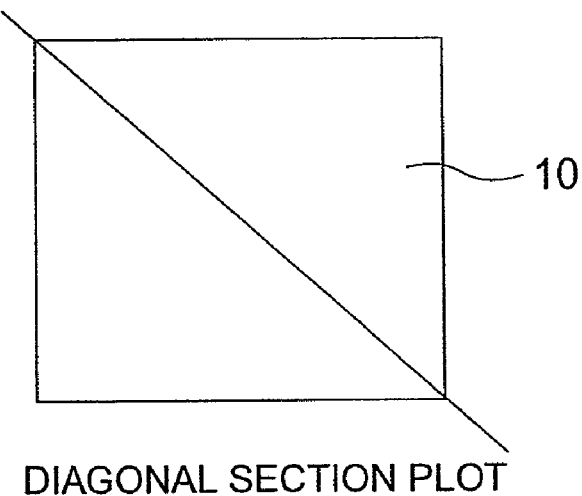
Figure 7B:
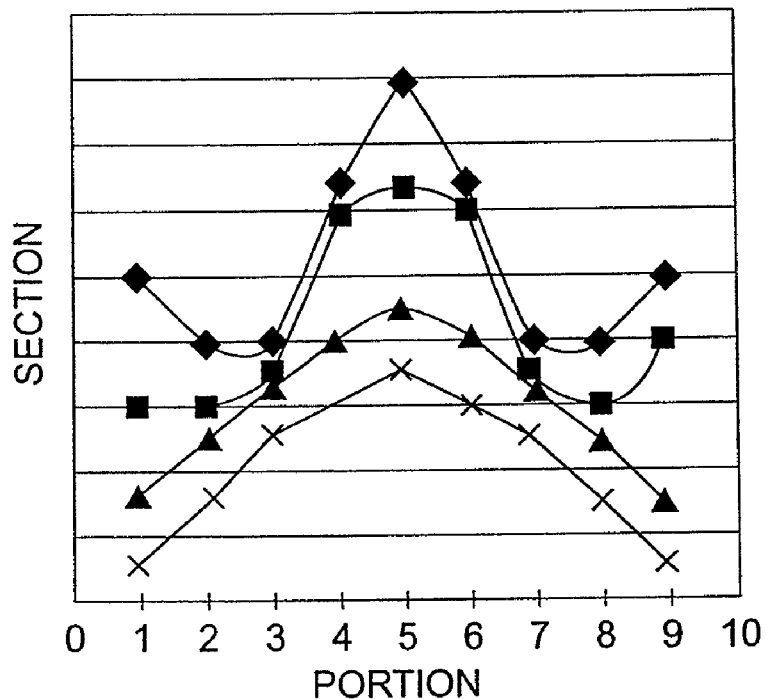
Figure 7B:
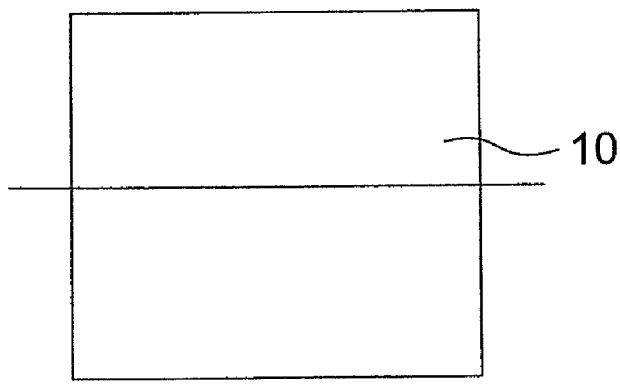
Figure 8:
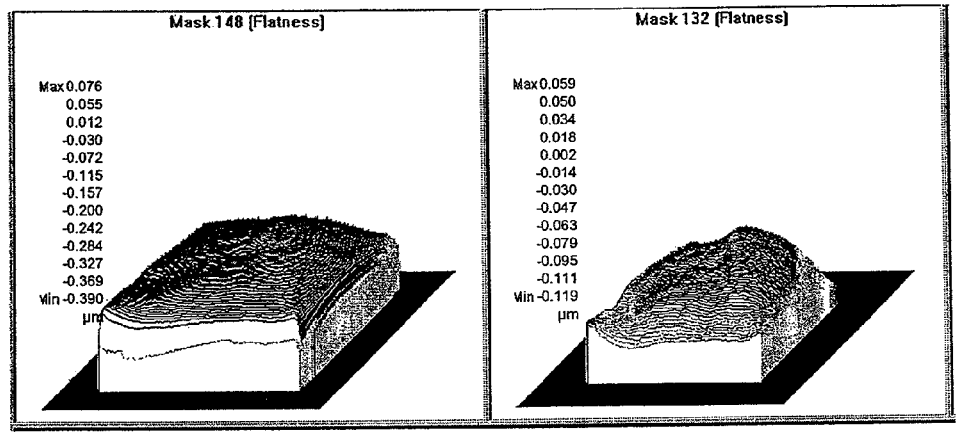
FIG. 8 is a bird's-eye view showing the shape of the main surface of Example 1.
Figure 9:
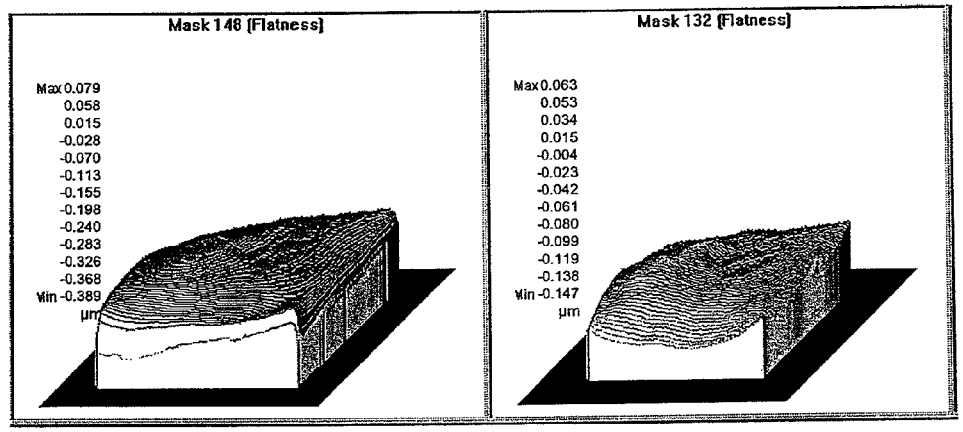
FIG. 9 is a bird's-eye view showing the shape of the main surface of Example 2.
Figure 10:
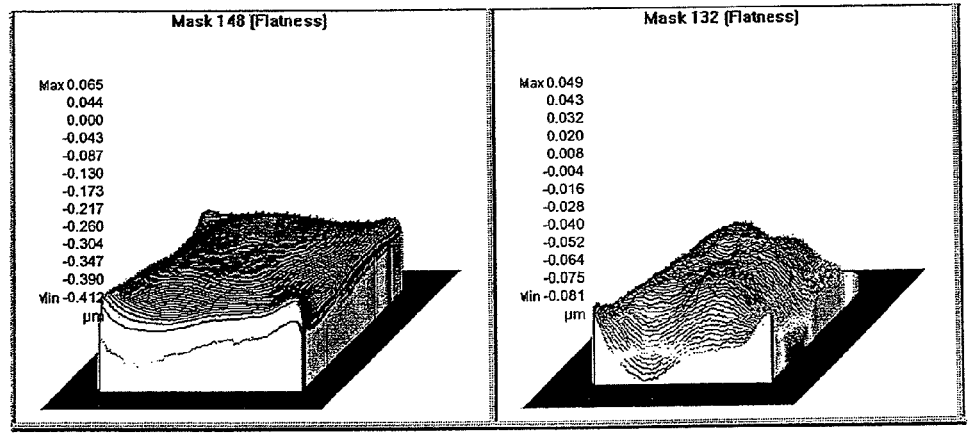
FIG. 10 is a bird's-eye view showing the shape of the main surface of Example 3.
Figure 11:
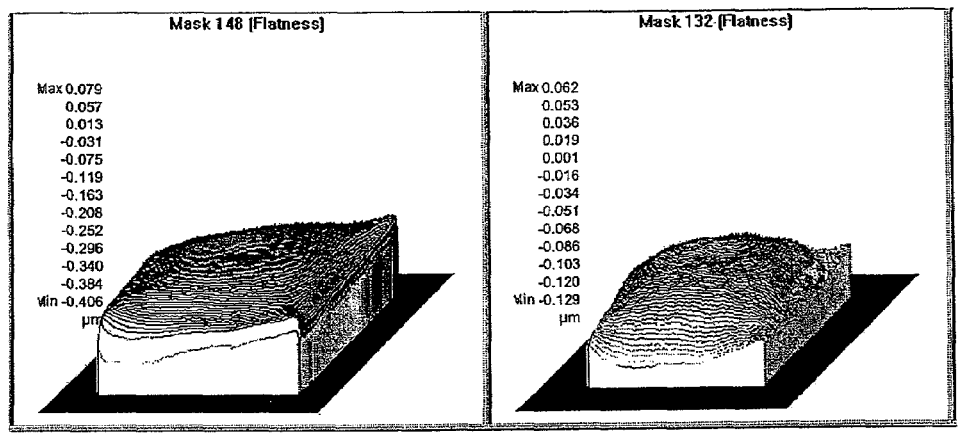
FIG. 11 is a bird's-eye view showing the shape of the main surface of Example 4.
Figure 12:
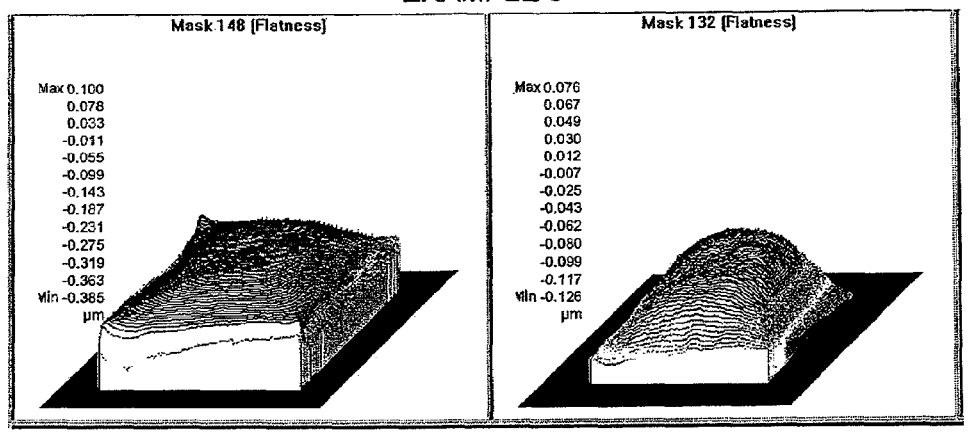
FIG. 12 is a bird's-eye view showing the shape of the main surface of Example 5.
Figure 13:
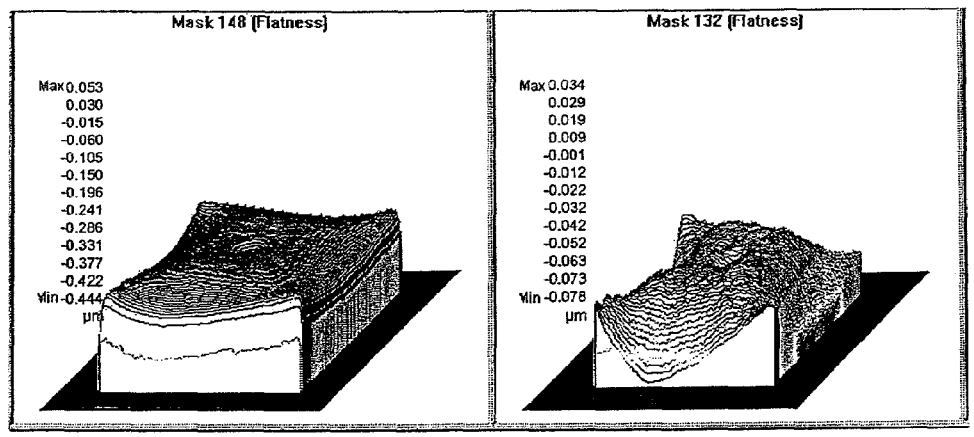
FIG. 13 is a bird's-eye view showing the shape of the main surface of Example 6.
Figure 14:
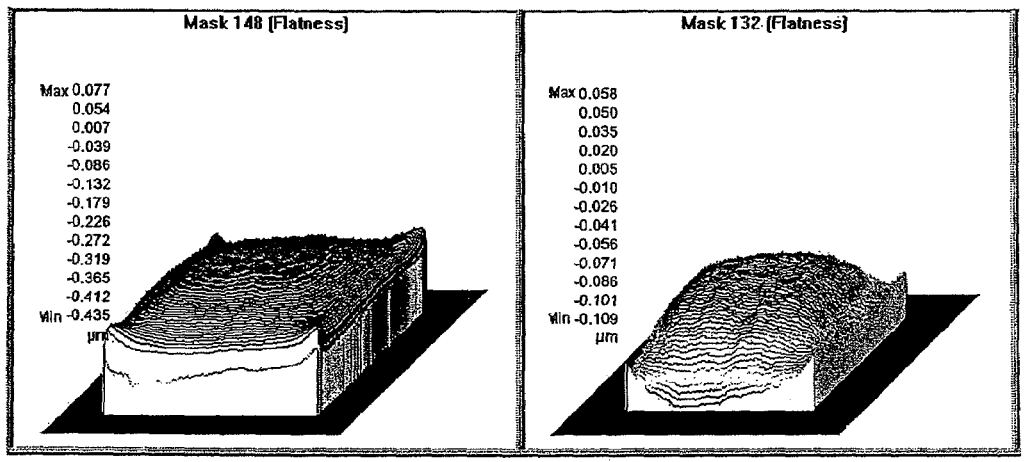
FIG. 14 is a bird's-eye view showing the shape of the main surface of Example 7.
Figure 15:
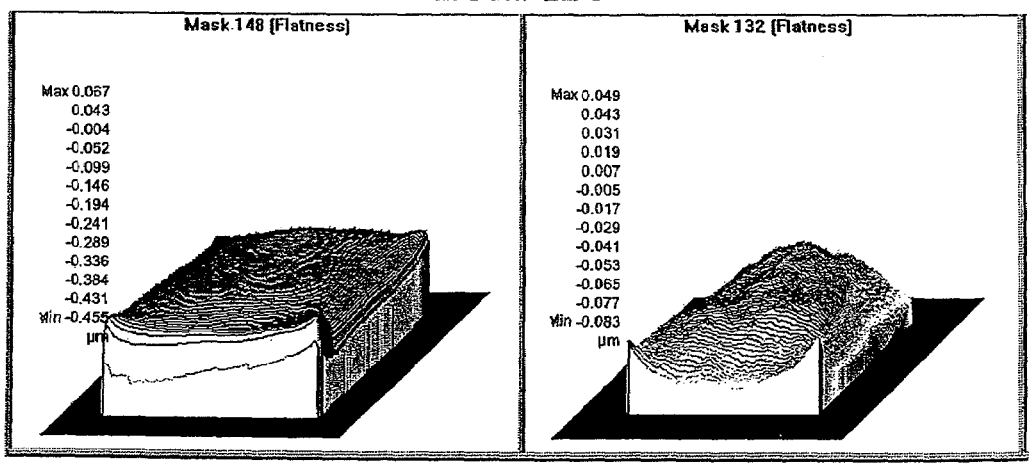
FIG. 15 is a bird's-eye view showing the shape of the main surface of Example 8.
Figure 16:
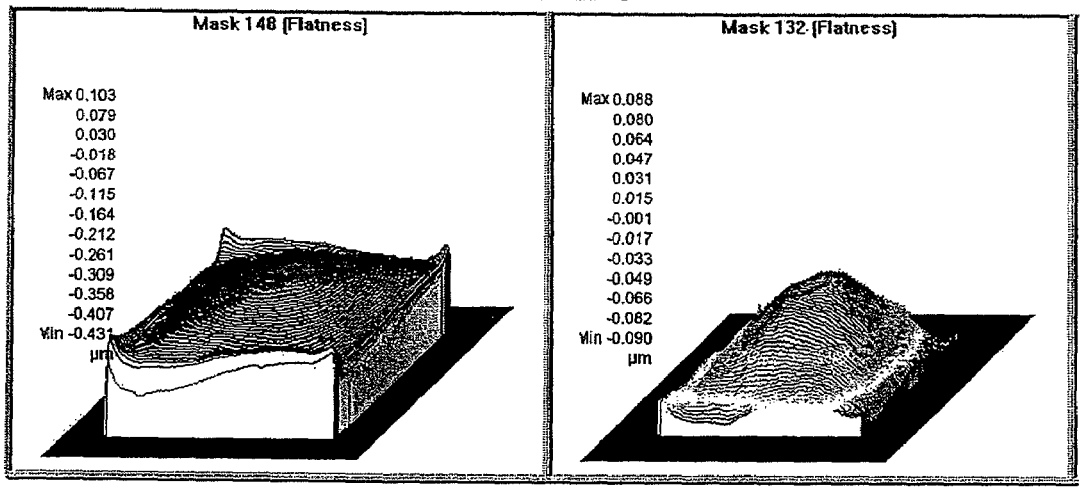
FIG. 16 is a bird's-eye view showing the shape of the main surface of Example 9.
Figure 17:
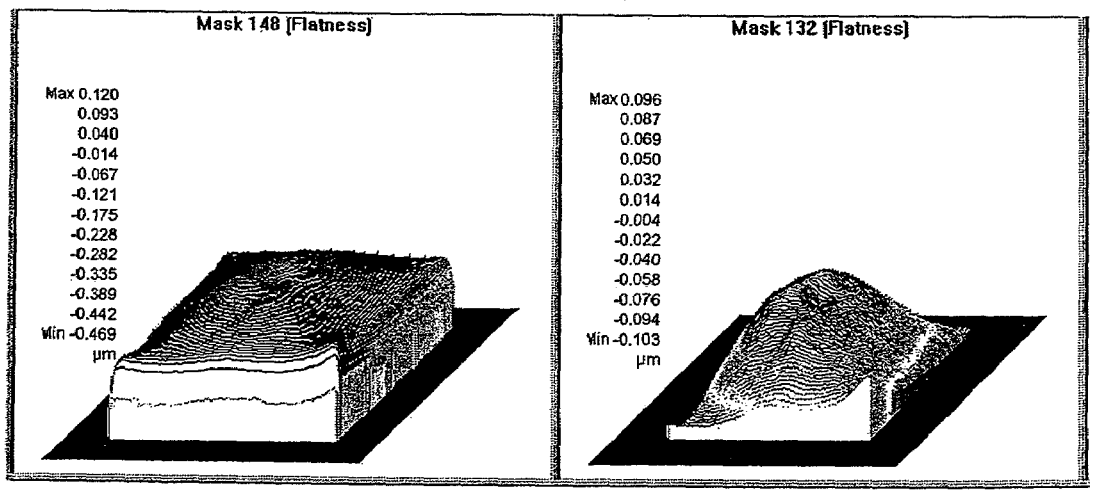
FIG. 17 is a bird's-eye view showing the shape of the main surface of Example 10.
Figure 18:
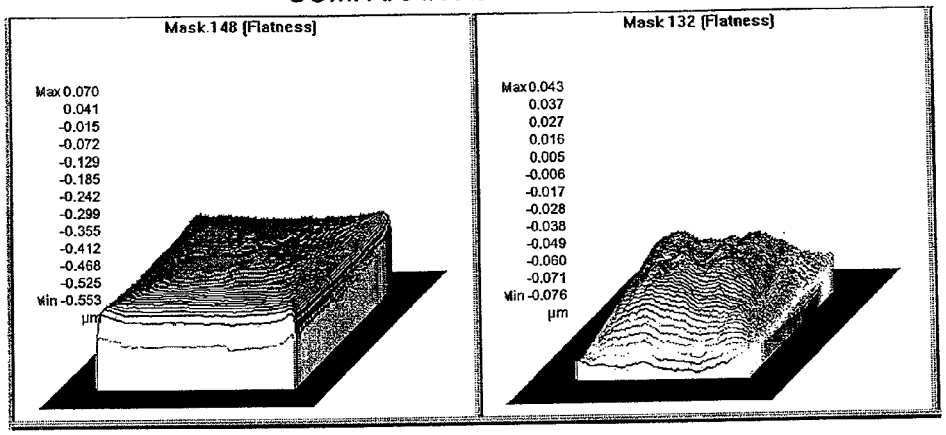
FIG. 18 is a bird's-eye view showing the shape of the main surface of Comparative Example 1.
Figure 19:
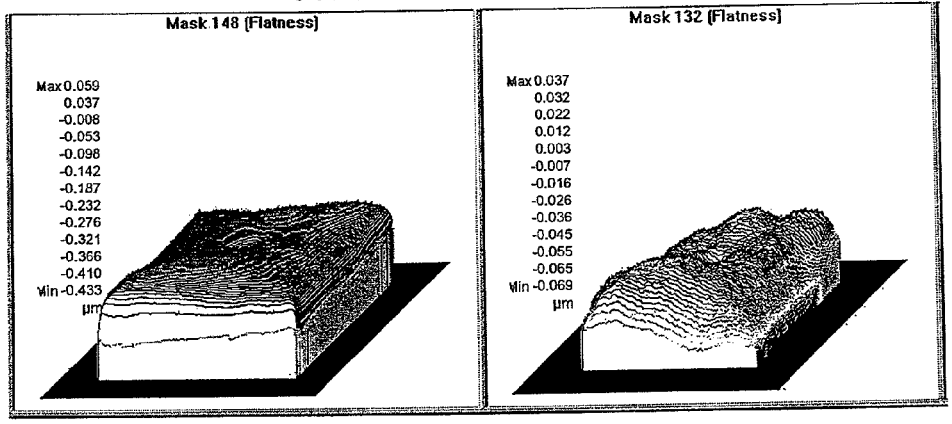
FIG. 19 is a bird's-eye view showing the shape of the main surface of Comparative Example 2.
Figure 20:
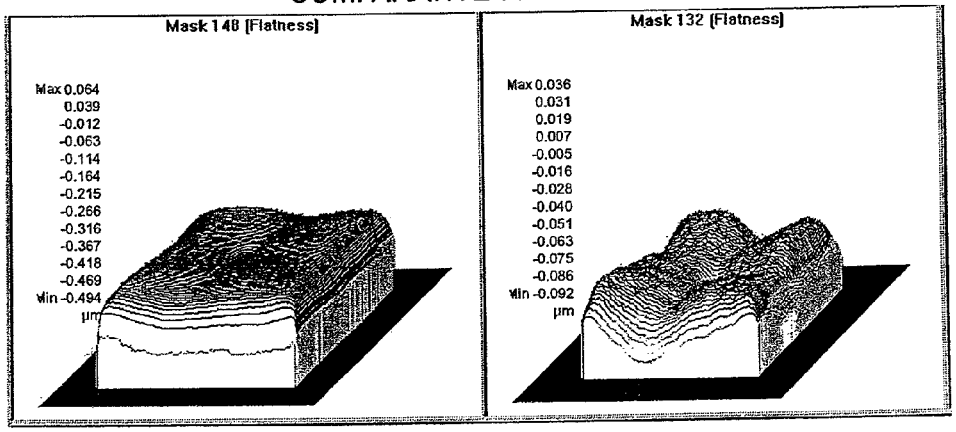
FIG. 20 is a bird's-eye view showing the shape of the main surface of Comparative Example 3.

FIGS. 7A and 7B are diagrams for explaining the final polishing process in step S108 in further detail. FIG. 7A shows changes in shape of a diagonal section of the mask blank substrate 10, while FIG. 7B shows changes in shape of a transverse section of the mask blank substrate 10. In step S108, a substrate (base member) selected in step S106 is polished to a final shape through intermediate states as indicated by histories 1 and 2.

Herein, with respect to the diagonal section, the base member selected in step S106 has a convex shape near the center and a frame shape rising at corner portions and is concave between the center and the corner portions. With respect to the transverse section, the base member has a convex shape near the center and a frame shape rising at end portions and is concave between the center and the end portions. The end portions of the transverse section may be flat. Further, portions between the center and the end portions in the transverse section may be flat.

Then, toward history 1 of the intermediate state, the diagonal section is polished under the conditions that processing of portions 1 and 9 at the corner portions advances faster than processing of portion 5 at the center portion (processing of portions 1 and 9>processing of portion 5). Meanwhile, fine processing is performed for intermediate portion 3 and the like.

On the other hand, toward history 1, the transverse section is polished under the conditions that processing of portions 1 and 9 at the end portions and processing of portion 5 at the center portion advance to the same degree (processing of portions 1 and 9=processing of portion 5). Meanwhile, fine processing is performed for intermediate portion 3 and the like. This polishing is advanced to a degree where, for example, the height of portions 1 and 9 and the height of portion 5 approximate to each other in the transverse section.

Then, toward history 2 of the intermediate state, the diagonal section is further polished under the conditions that processing of portions 1 and 9 at the corner portions advances faster than processing of portion 5 at the center portion (processing of portions 1 and 9>processing of portion 5). Meanwhile, fine processing is further performed for intermediate portion 3 and the like. This polishing is advanced to a degree where, for example, the height of portions 1 and 9 and the height of portion 5 approximate to each other in the diagonal section.

On the other hand, toward history 2, the transverse section is further polished under the conditions that processing of portions 1 and 9 at the end portions and processing of portion 5 at the center portion advance to the same degree (processing of portions 1 and 9=processing of portion 5). By this polishing, portions 1 and 9 are processed to a roll-off shape.

Then, toward the final shape, the diagonal section is further polished under the conditions that processing of portions 1 and 9 at the corner portions advances faster than processing of portion 5 at the center portion (processing of portions 1 and 9>processing of portion 5). Meanwhile, fine processing is further performed for intermediate portion 3 and the like. This polishing is finished while the frame shape of portions 1 and 9 still remains. Otherwise, i.e. if the polishing continues as it is, portions 1 and 9 are processed to a roll-off shape.

On the other hand, toward the final shape, the transverse section is polished uniformly at all portions thereof so as to be processed to a convex shape. If polishing is carried out in this manner, the final polishing of the mask blank substrate 10 can be appropriately performed.

Hereinbelow, this invention will be described in further detail with reference to examples.

Examples 1 to 10 of mask blank substrates 10 according to this invention and Comparative Examples 1 to 3 were manufactured by the manufacturing method as described with reference to FIGS. 6, 7A, and 7B. A material of each mask blank substrate was a synthetic quartz glass having optical transparency with respect to exposure light. The main surface of the mask blank substrate was 152 mm square and a flatness measurement area 16 was 148 mm square. Since the size of a pattern area of an exposure mask is 132 mm×110 mm, a pattern area 14 in the mask blank substrate was set to 132 mm square in consideration of rotation by 90°.

Table 1 shows shape characteristics of Examples 1 to 10 of this invention and Comparative Examples 1 to 3. FIGS. 8 to 20 are bird's-eye views showing the shapes of the main surfaces of Examples 1 to 10 and Comparative Examples 1 to 3. In Table 1, "Flatness after Chucking" represents the flatness of the pattern area 14 after chucking.

TABLE 1

| | Flatness of Flatness Measurement Area (μm) | Shape of Corner Portion of Flatness Measurement Area | Flatness after Chucking (μm) |
|---|---|---|---|
| Example 1 | 0.466 | Ski-jump (3 portions) | 0.125 |
| Example 2 | 0.468 | Ski-jump (3 portions) | 0.184 |
| Example 3 | 0.477 | Ski-jump (4 portions) | 0.148 |
| Example 4 | 0.485 | Ski-jump (3 portions) | 0.187 |
| Example 5 | 0.485 | Ski-jump (4 portions) | 0.227 |
| Example 6 | 0.497 | Ski-jump (4 portions) | 0.149 |
| Example 7 | 0.512 | Ski-jump (4 portions) | 0.167 |
| Example 8 | 0.522 | Ski-jump (4 portions) | 0.220 |
| Example 9 | 0.534 | Ski-jump (4 portions) | 0.184 |
| Example 10 | 0.589 | Ski-jump (4 portions) | 0.175 |
| Comparative Example 1 | 0.673 | Ski-jump (4 portions) | 0.278 |
| Comparative Example 2 | 0.542 | Ski-jump (2 diagonal portions) | 0.269 |
| Comparative Example 3 | 0.558 | roll-off | 0.350 |

A light shielding film with a reflection preventing function containing, as a main component, chromium with a low film stress such that a flatness change due to a film stress is 0.08 μm or less was formed by sputtering on the main surface including the flatness measurement area 16 of each mask blank substrate and then a positive resist was formed on the light shielding film by a rotary application method. In this manner, a mask blank was obtained.

The flatness of the mask blank obtained after having been chucked in an exposure system was as shown in Table 1 and, in the case of Comparative Examples 1 to 3, the flatness of the substrate main surface after having been chucked in the exposure system resulted in exceeding 0.24 μm. This flatness represents a position accuracy such that a focus budget allowed for a reticle does not satisfy 0.24 μm when reduction (¼ magnification) exposure is performed to form a transfer pattern on a semiconductor substrate, thus resulting in deviating from the specification of 65 nm semiconductor design rule.

In Comparative Example 1, the flatness of the flatness measurement area 16 exceeded 0.6 μm. Further, in Comparative Examples 2 and 3, the number of corner portions of the flatness measurement area 16 having a ski-jump shape was less than three.

On the other hand, in Examples 1 to 10, the flatness of the flatness measurement area 16 was 0.6 μm or less and, further, at least three of corner portions of the flatness measurement area 16 had a ski-jump shape. Consequently, in the case of Examples 1 to 10, the flatness of the substrate main surface after having been chucked in the exposure system resulted in 0.24 μm or less. In this case, the position accuracy is achieved wherein the focus budget allowed for a reticle satisfies 0.24 μm, thereby satisfying the specification of 65 nm semiconductor design rule.

Then, Examples 11 to 16 of mask blank substrates 100 according to this invention and Comparative Examples 4 to 6 were manufactured by the manufacturing method as described with reference to FIGS. 6, 7A, and 7B.

Table 2 shows shape characteristics of Examples 11 to 16 of this invention and Comparative Examples 4 to 6. In Table 2, "Flatness after Chucking" represents the flatness of a pattern area 140 after chucking. Further, in Table 2, heights h'(1), h'(2), h'(3), and h'(4) represent, respectively, heights at corners 190 (four portions) of an outer rectangular area excluding an area of 10 mm inward from the outer peripheral end surface on the substrate main surface using, as references, heights at corresponding corners 180 (four portions) of an inner rectangular area 170 excluding an area of 15 mm inward from the outer peripheral end surface on the substrate main surface in FIG. 4.

TABLE 2

|  | Flatness of Flatness Measurement Area (μm) | Height h' (1) (μm) | Height h' (2) (μm) | Height h' (3) (μm) | Height h' (4) (μm) | Flatness after Chucking (μm) |
|---|---|---|---|---|---|---|
| Example 11 | 0.485 | −0.0089 | −0.0186 | −0.0008 | 0.0024 | 0.187 |
| Example 12 | 0.485 | −0.0015 | 0.0065 | −0.0163 | −0.0098 | 0.227 |
| Example 13 | 0.497 | 0.0116 | 0.0107 | −0.0021 | 0.0053 | 0.149 |
| Example 14 | 0.512 | 0.0169 | 0.0058 | 0.0078 | 0.0161 | 0.167 |
| Example 15 | 0.534 | 0.0228 | 0.033 | 0.0117 | 0.0186 | 0.184 |
| Example 16 | 0.589 | −0.0013 | −0.003 | −0.0069 | 0.0135 | 0.175 |
| Comparative Example 4 | 0.542 | −0.0303 | −0.0169 | −0.0292 | −0.0175 | 0.269 |
| Comparative Example 5 | 0.558 | −0.0344 | −0.0619 | −0.0455 | −0.0371 | 0.350 |
| Comparative Example 6 | 0.673 | 0.0178 | 0.0254 | −0.0014 | 0.0093 | 0.278 |

A light shielding film with a reflection preventing function containing, as a main component, chromium with a low film stress such that a flatness change due to a film stress is 0.08 μm or less was formed by sputtering on the main surface including a flatness measurement area 160 of each mask blank substrate and then a positive resist was formed on the light shielding film by the rotary application method. In this manner, a mask blank was obtained.

The flatness of each obtained mask blank after having been chucked in the exposure system was as shown in Table 2 and, in the case of Comparative Examples 4 to 6, the flatness of the substrate main surface after having been chucked in the exposure system resulted in exceeding 0.24 μm. This flatness represents the position accuracy such that the focus budget allowed for a reticle does not satisfy 0.24 μm when reduction (¼ magnification) exposure is performed to form a transfer pattern on a semiconductor substrate, thus resulting in deviating from the specification of 65 nm semiconductor design rule.

In Comparative Examples 4 and 5, the height h' deviated from the condition of not less than −0.02 μm and not more than 0.05 μm. Further, in Comparative Example 6, the flatness of the flatness measurement area 160 exceeded 0.6 μm.

On the other hand, in Examples 11 to 16, the flatness of the flatness measurement area 160 was 0.6 μm or less and, further, the heights h' at all the four portions were not less than −0.02 μm and not more than 0.05 μm. Consequently, in the case of Examples 11 to 16, the flatness of the substrate main surface after having been chucked in the exposure system resulted in 0.24 μm or less. In this case, such position accuracy that the focus budget allowed for a reticle satisfied 0.24 μm was achieved. Thus, the specification of 65 nm semiconductor design rule was satisfied.

While this invention has been described in terms of the embodiments, the technical scope of this invention is not limited thereto. It is obvious for a person skilled in the art that various changes or improvements can be added to the foregoing embodiments. It is clear from the recitation of the appended claims that embodiments with such changes or modifications are also included in the technical scope of this invention.

What is claimed is:

1. A mask blank substrate to be chucked by a mask stage of an exposure system, comprising:

a rectangular flatness measurement area having four measurement area corners, said flatness measurement area excluding an area of 2 mm inward from an outer peripheral end surface on a main surface of the mask blank substrate on a side to be chucked by the mask stage, and a rectangular inner area having four inner area corners, said inner area excluding an area of 10 mm inward from the outer peripheral end surface, wherein flatness of the rectangular flatness measurement area is 0.6 μm or less, and each of at least three of the four measurement area corners is higher than a respective one of the corresponding inner area corner using, as a reference, a height of the inner area corner.

2. A mask blank substrate according to claim 1, wherein:

a rising shape is formed from each of at least three corresponding inner area corners towards a respective one of the corresponding measurement area corners.

3. A mask blank substrate according to claim 1, wherein:

the three measurement area corners each have height of 0.25 μm or less, but greater than 0, using, as a reference point, the height of one of the three inner area corners.

4. A mask blank substrate according to claim 1, wherein:

the mask stage of the exposure system comprises a chuck member for sticking by suction to the main surface of the mask blank substrate, the chuck member comprising:

three support portions extending linearly in parallel to the main surface and supporting the main surface by the use of at least part of the three support portions; and two suction ports formed between the three support portions.

5. A mask blank, wherein:
a thin film to be a mask pattern is formed on the main surface of the mask blank substrate according to claim 1.

6. An exposure mask, wherein:
a mask pattern is formed on the main surface of the mask blank substrate by patterning the thin film according to claim 5.

7. A semiconductor manufacturing method, comprising:
setting the exposure mask according to claim 6 on the mask stage of the exposure system; and
irradiating exposure light onto the exposure mask to transfer the mask pattern to thereby form a pattern on a semiconductor wafer.

8. A mask blank substrate to be chucked by a mask stage of an exposure system, comprising:
a rectangular flatness measurement area excluding an area of 2 mm inward from an outer peripheral end surface on a main surface of the mask blank substrate on a side to be chucked by the mask stage,
an outer rectangular area having four outer area corners, said outer rectangular area excluding an area of 10 mm inward from the outer peripheral end surface, and
an inner rectangular area having four inner area corners, said inner rectangular area excluding an area of 15 mm inward from the outer peripheral end surface,
wherein flatness of the rectangular flatness measurement area is 0.6 μm or less, and
at least one of the four outer area corners is higher than a corresponding one inner area corner using, as a reference, a height of the inner area corner.

9. A mask blank substrate according to claim 8, wherein:
a rising shape is formed from the one inner area corner towards the corresponding one outer area corner.

10. A mask blank substrate according to claim 8, wherein:
the mask stage of the exposure system comprises a chuck member for sticking by suction to the main surface of the mask blank substrate,
the chuck member comprising:
three support portions extending linearly in parallel to the main surface and supporting the main surface by the use of at least part of the three support portions; and
two suction ports formed between the three support portions.

11. A mask blank, wherein:
a thin film to be a mask pattern is formed on the main surface of the mask blank substrate according to claim 8.

12. An exposure mask, wherein:
a mask pattern is formed on the main surface of the mask blank substrate by patterning the thin film according to claim 11.

13. A semiconductor manufacturing method, comprising:
setting the exposure mask according to claim 12 on the mask stage of the exposure system; and
irradiating exposure light onto the exposure mask to transfer the mask pattern to thereby form a pattern on a semiconductor wafer.

14. A mask blank substrate according to claim 1, wherein:
a correspondence of the measurement area corner and the inner area corner is defined by a diagonal line passing between opposed corners at an outer peripheral surface of the substrate and through a center of the substrate.

15. A mask blank substrate according to claim 8, wherein:
a correspondence of the outer area corner and the inner area corner is defined by a diagonal line passing between opposed corners at an outer peripheral surface of the substrate and through a center of the substrate.

* * * * *